(12) United States Patent
Su

(10) Patent No.: US 7,815,836 B2
(45) Date of Patent: Oct. 19, 2010

(54) PACKAGING APPARATUS FOR OPTICAL-ELECTRONIC SEMICONDUCTORS

(75) Inventor: Cheng-Hong Su, Taipei (TW)

(73) Assignees: Silitek Electronic (Guangzhou) Co., Ltd., Guangzhou (CN); Lite-On Technology Corporation, Taipei (TW)

( * ) Notice: Subject to any disclaimer, the term of this patent is extended or adjusted under 35 U.S.C. 154(b) by 155 days.

(21) Appl. No.: 12/155,270

(22) Filed: Jun. 2, 2008

(65) Prior Publication Data

US 2009/0152712 A1 Jun. 18, 2009

(30) Foreign Application Priority Data

Dec. 14, 2007 (TW) .............................. 96148023 A

(51) Int. Cl.
*H01L 21/52* (2006.01)
(52) U.S. Cl. ................... 264/272.17; 257/712; 257/687
(58) Field of Classification Search .................. 257/88, 257/99, 684, 712, 797; 29/25.01; 264/272.17, 264/1.1, 2.5, 104, 220; 425/123
See application file for complete search history.

(56) References Cited

U.S. PATENT DOCUMENTS

| | | | |
|---|---|---|---|
| 6,652,795 B2 * | 11/2003 | Konishi et al. | 264/272.13 |
| 2005/0150624 A1 * | 7/2005 | Toh et al. | 162/218 |

* cited by examiner

*Primary Examiner*—Howard Weiss
*Assistant Examiner*—Tifney L Skyles
(74) *Attorney, Agent, or Firm*—Rosenberg, Klein & Lee

(57) ABSTRACT

A packaging apparatus for optical-semiconductors includes a mold base having a longitudinal receiving space, an encapsulating module attached to the mold base, and a fixing member attached to the encapsulating module. The bottom of the mold base has at least one air-vent and the mold base has a predetermined width. The encapsulating module includes a plate engaged with the mold base, a plurality of molding bodies penetrating the plate and received in the receiving space, and a plurality of supporting members connected to the molding bodies. The fixing member has a plurality of holding slots to hold the supporting members so that the supporting members are more stable. Furthermore, the width of the mold base is optimized with the dimension of a furnace so that the production rate is increased and the stability of the packaging structure is improved.

15 Claims, 7 Drawing Sheets

PACKAGING APPARATUS FOR OPTICAL-ELECTRONIC SEMICONDUCTORS

BACKGROUND OF THE INVENTION

1. Field of the Invention

The present invention relates to a packaging apparatus and a packaging method for the optical-electronic semiconductors. The invention in particular relates to a packaging apparatus and a packaging method for improving production efficiency and accuracy of optical-electronic semiconductors.

2. Description of Prior Art

Light emitting diodes (LEDs) have characteristics of small-size, and low-energy consumption so that they are commonly used in electronic productions and display applications. For example, LEDs are applied to traffic lights and cellular phones.

For advanced development of the portable device, engineers focus on increasingly smaller-sized packaging method and ever brighter LED intensity. The traditional packaging methods include dispensing process, encapsulating process, the molding process and so on—and Epoxy with good adhesive and forming property is required for each mentioned process. The encapsulating process using traditional mold can be applied to packaging of Lamp-LED. First step of the encapsulating process is injecting Epoxy into a mold and then inserting connection metal into the Epoxy. The mold, the epoxy, and the inserted metal connection are then placed in a furnace and heated. At last, Epoxy is cured and the packaging process is accomplished.

However, traditional mold only receives one row of LEDs, so the production rate of the packaging process is limited. Furthermore, the connection metal is inserted in a hole formed by a plastic member that deforms gradually due to friction and usage. As the plastic member deforms, the position of the connection metal will no longer be held precisely and the connection metal eventually becomes off center within the LED mold.

Also, the traditional mold is an enclosed mold and the heated air cannot reach the LED body directly. Thus, a temperature difference occurs between the LED body and furnace. Thus, the heat exchange is not easily controlled and the heating accuracy of the LED is low.

Therefore, in view of this, the inventor proposes the present invention to overcome the above problems based on his expert experience and deliberate research.

SUMMARY OF THE INVENTION

The primary object of the present invention is to provide for a packaging apparatus for optical-electronic semiconductors and a packaging method therefor. The present invention is applied for increasing the production rate.

Another object of the present invention is to provide a method for improving the heating uniformity of the furnace hot air so as to optimize the stability of the curing quality of the optical-electronic semiconductors.

A further object of the present invention is to hold the position of the supporting members precisely so as to prevent the supporting members from off-centering.

In order to achieve the above objects, the present invention provides a packaging apparatus for optical-electronic semiconductors that comprises a mold base, an encapsulating module, and a fixing member. The encapsulating module is used for holding a plurality of columns of molding bodies inside the mold base. There is at least one first air-vent formed on the bottom of the mold base so that the heated air can flow to contact the molding bodies in order to improve the uniformity of heating process. The fixing member is used for positioning a plurality of columns of supporting members connected to the molding bodies so as to solve the off-centering issue of the traditional packaging method. On the other hand, the fixing member provides a supporting and pressing functions as the baking procedure.

The present invention is provided for increasing the production precision of the optical-electronic semiconductors after the heating process.

The cost of the process is reduced compare to traditional process because of the optimization of the width of the packaging apparatus.

In order to better understand the characteristics and technical contents of the present invention, a detailed description thereof will be made with reference to accompanying drawings. However, it should be understood that the drawings and the description are illustrative but not used to limit the scope of the present invention.

DETAILED DESCRIPTION OF THE INVENTION

Figure 1:
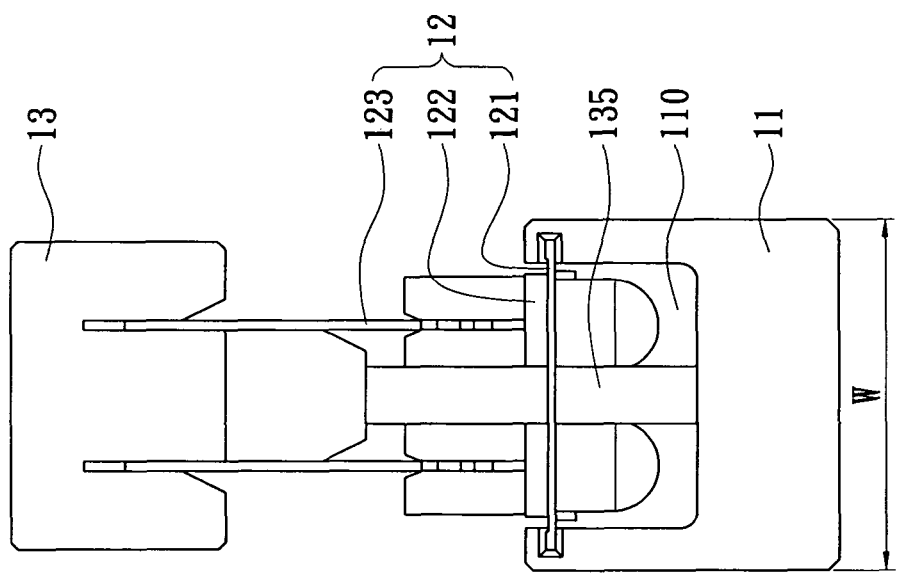
FIG. 1 is a front view showing the packaging apparatus for optical-electronic semiconductors according to the present invention.

Please refer to FIGS. 1-7, the invention discloses a packaging apparatus and a packaging method for optical-electronic semiconductors. The apparatus and the method are applied for optical-electronic semiconductors, such as light emitting diodes, receiver chips and etc. The packaging apparatus 1 comprises a mold base 11, an encapsulating module 12 attached to mold base 11, and a fixing member 13 attached to encapsulating module 12. The mold base 11 has a longitudinal receiving space 110 and at least one first air-vent 111 at the bottom thereof. The mold base 11 has a predetermined width W and the first air-vent 111 communicates with the longitudinal receiving space 110. The encapsulating module 12 has a plate 121 attached to mold base 11, a plurality of columns of molding bodies 122 penetratingly mounted on plate 121 and received in the longitudinal receiving space 110, and a plurality of columns of supporting members 123 connected to the molding bodies 122. The fixing member 13 has a plurality of columns of holding slots 133 for holding the supporting members 123 of the encapsulating module 12. The preferable embodiment is shown in FIG. 1. The encapsulating module 12 has two columns of molding bodies 122 and two columns of supporting members 123. Correspondingly, the fixing member 13 has two columns of holding slots 133 (shown in FIG. 5) for holding the two columns of supporting members 123. The holding slots 133 are used for positioning the two columns of supporting members 123 and to prevent the two columns of supporting members 123 from off-centering. The front view of the mold base 11 is a body with a cavity, such as U shape and the longitudinal receiving space 110 is defined in the hallow part of the cavity of the body. Longitudinal receiving space 110 is used for receiving the columns of molding bodies 122. However, the present invention is not restricted to two-column molding body 122 but could be three-column or multi-column molding body 122. The number of holding slots 133 can be adjusted depending on the number of molding body 122. On the other hand, the plate 121 is held by the holding groove of the mold base 11 but the plate 121 can be attached to mold base 11 by another method. The plate 121 is an iron plate in accordance with the embodiment.

Figure 2:
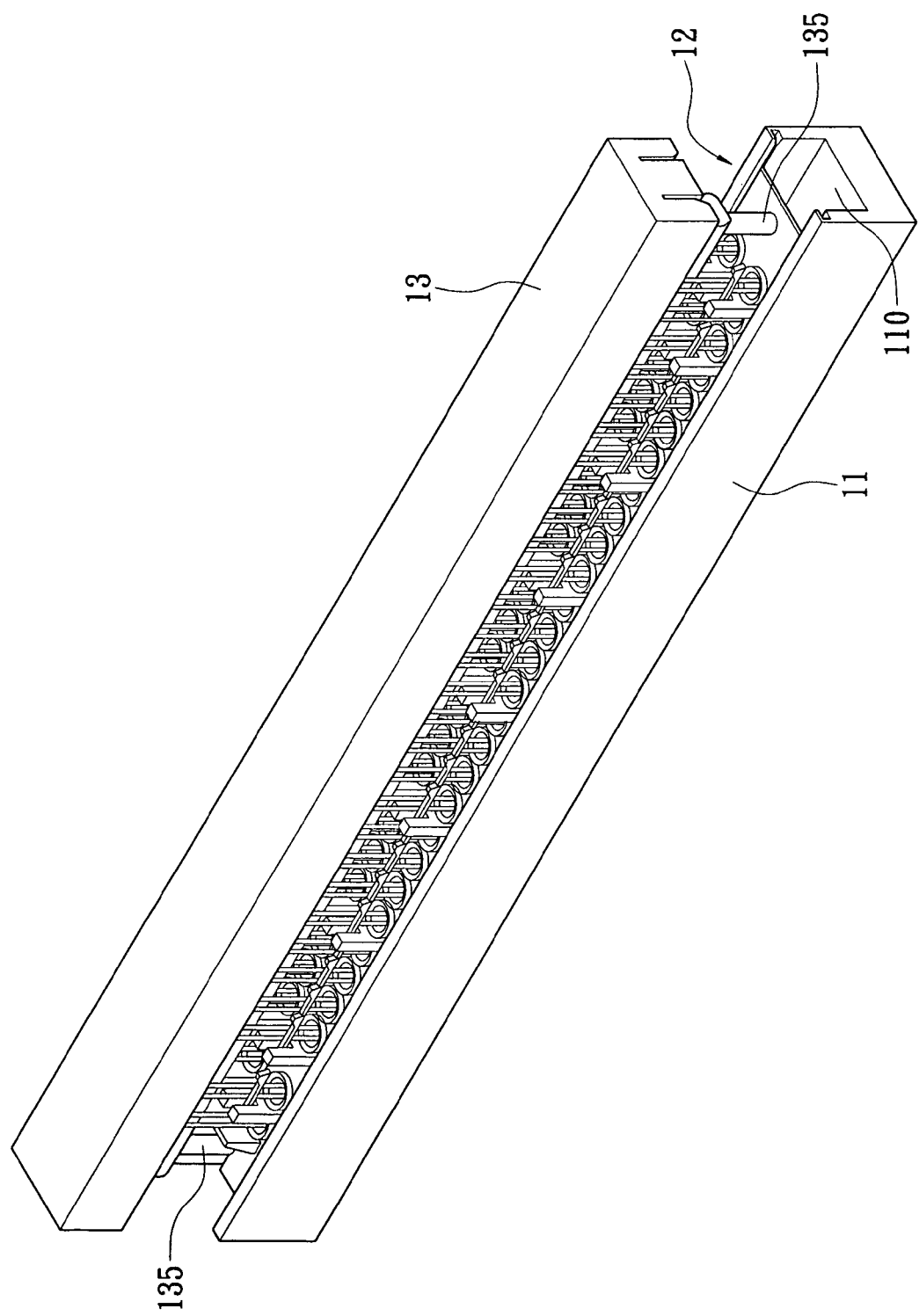
FIG. 2 is a perspective view showing the packaging apparatus for optical-electronic semiconductors according to the present invention.
Figure 3:
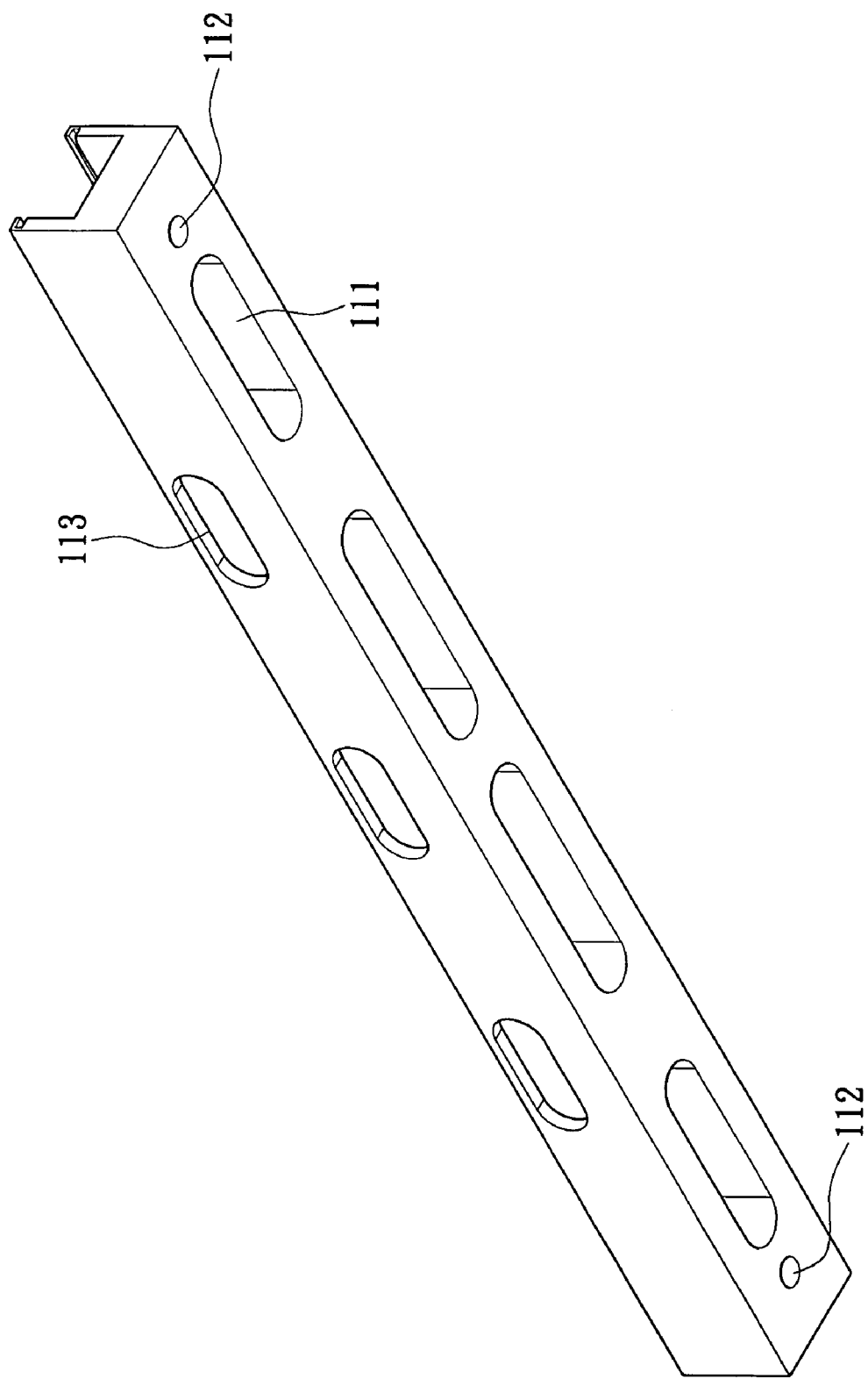
FIG. 3 shows the mold base of the packaging apparatus according to the present invention.
Figure 4:
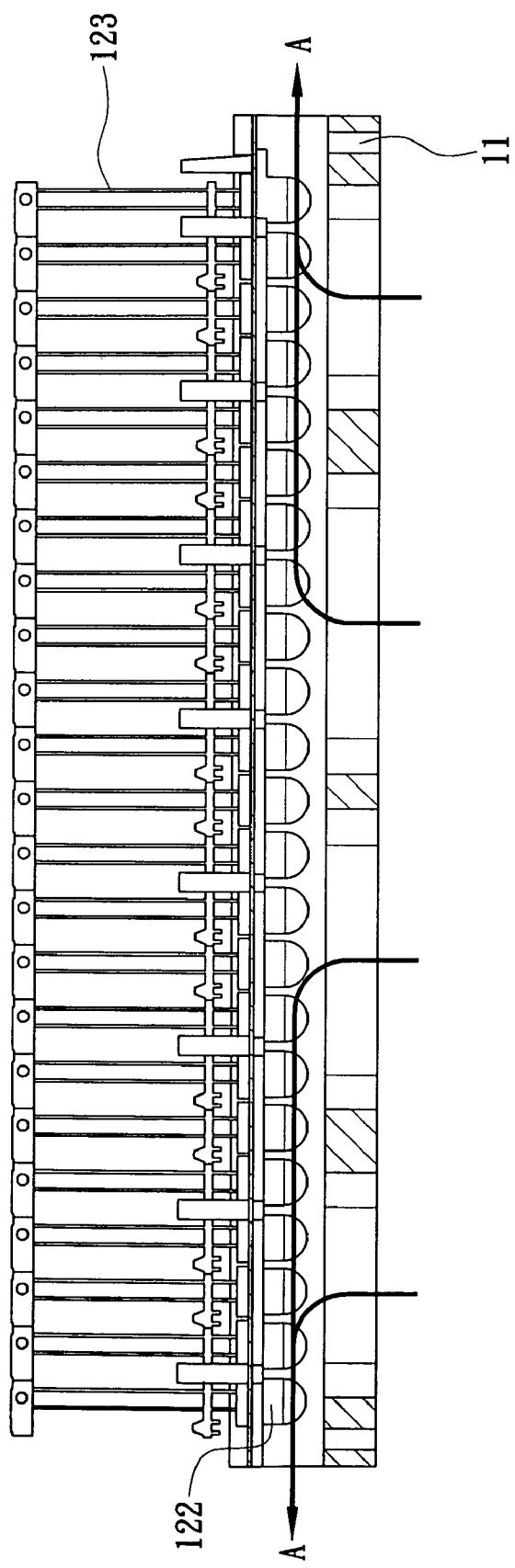
FIG. 4 shows the air circulation and the packaging apparatus according to the present invention.

Referring to FIG. 3, mold base 11 further has a fixed hole 112 on two ends thereof, and the fixing member 13 has a fixed body 135 (shown in FIG. 2) on two ends thereof corresponding to the fixed hole 112. The fixed body 135 is engaged with the fixed hole 112 so that the fixing member 13 is positioned in a balance and stable condition. In FIG. 2, only a mold base 11 is operated, however, two or more mold bases 11 can be used in coordination in the baking process.

The mold base 11 has at least one first air-vent 111 at the bottom thereof. In the embodiment, the mold base 11 has four first air-vents 111 at the bottom. The first air-vents 111 communicate with the longitudinal receiving space 110. When the packaging apparatus 1 is sent into an oven for baking, the heated air flows into the longitudinal receiving space 110 though the first air-vents 111. Therefore, the heated air directly heats the molding bodies 122 so as to improve the uniformity of heating. Furthermore, the heated air achieves a circulating flow as the arrow "A" shown in FIG. 4. In addition, a plurality of second air-vents 113 communicating with the longitudinal receiving space 110 is defined on the sides of the mold base 11 for optimizing the heating performance. The shapes and number of the first air-vents 111 and the second air-vents 113 are not restricted to the embodiment shown in FIG. 3.

Figure 5:
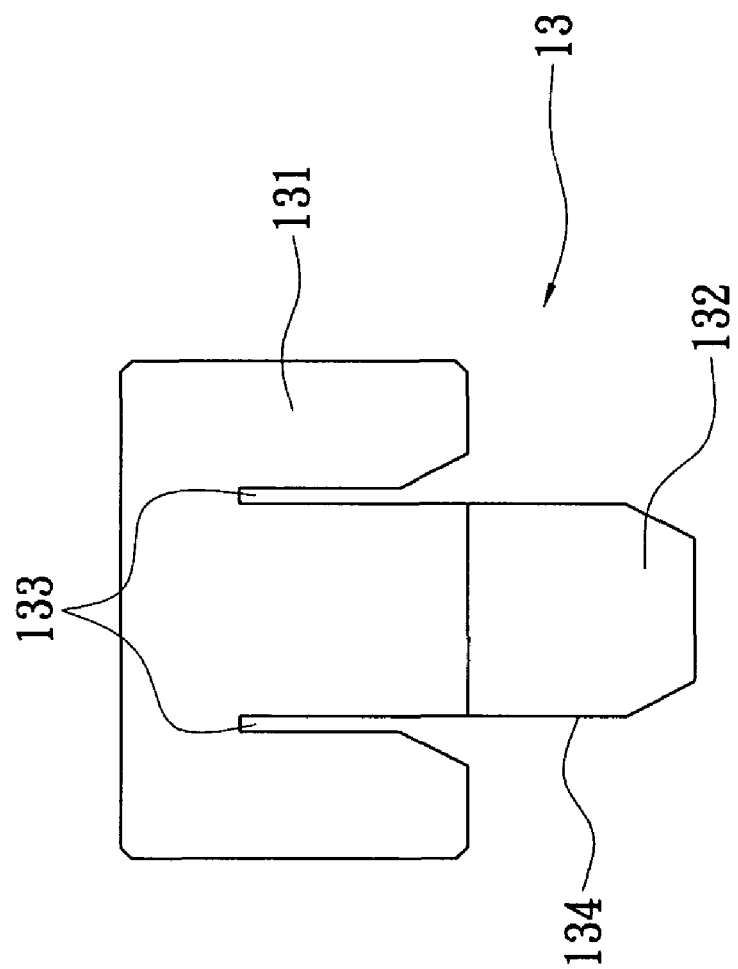
FIG. 5 shows the fixing member of the packaging apparatus according to the present invention.
Figure 6:
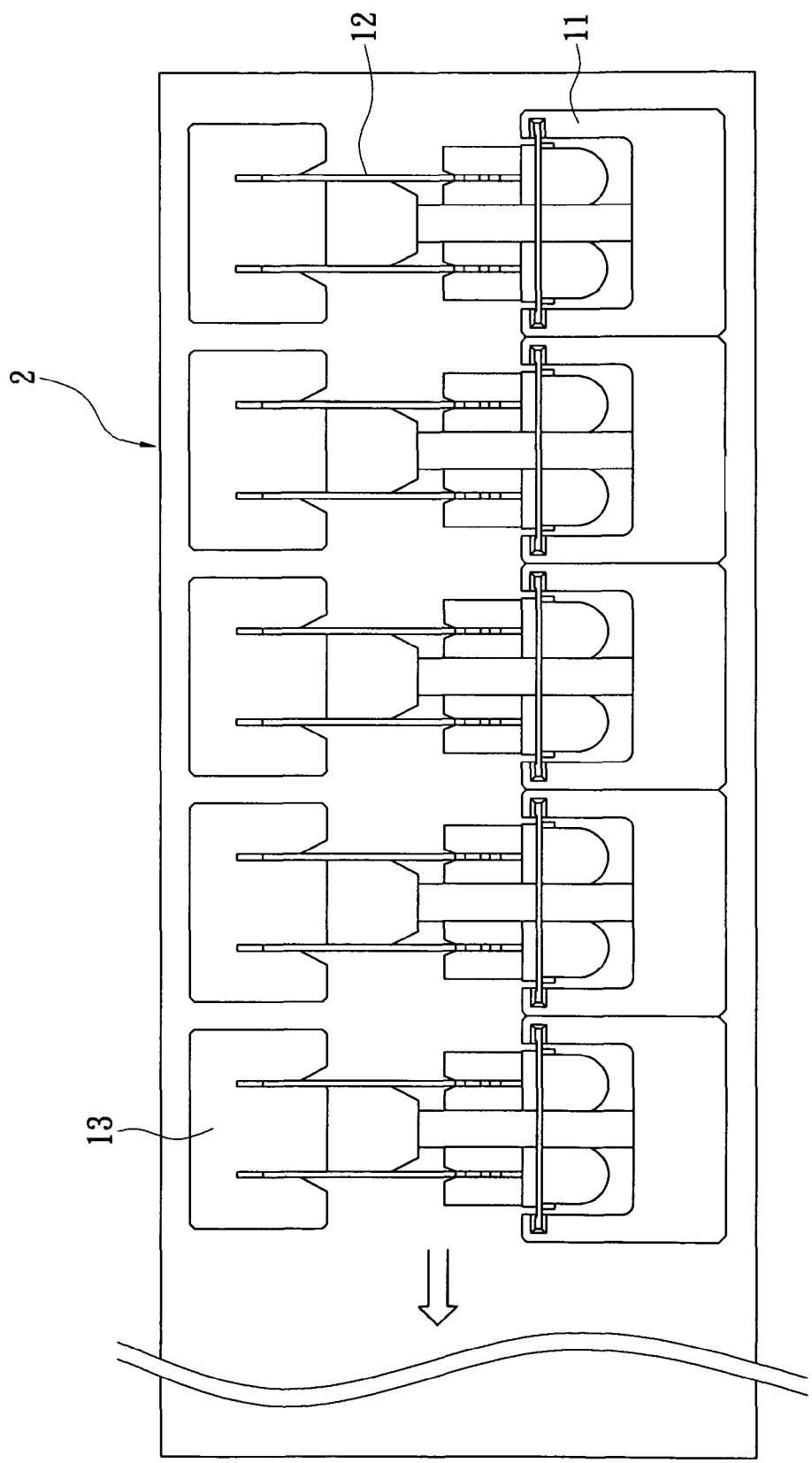
FIG. 6 shows the packaging apparatus entering into the heating device according to the present invention.
Figure 7:
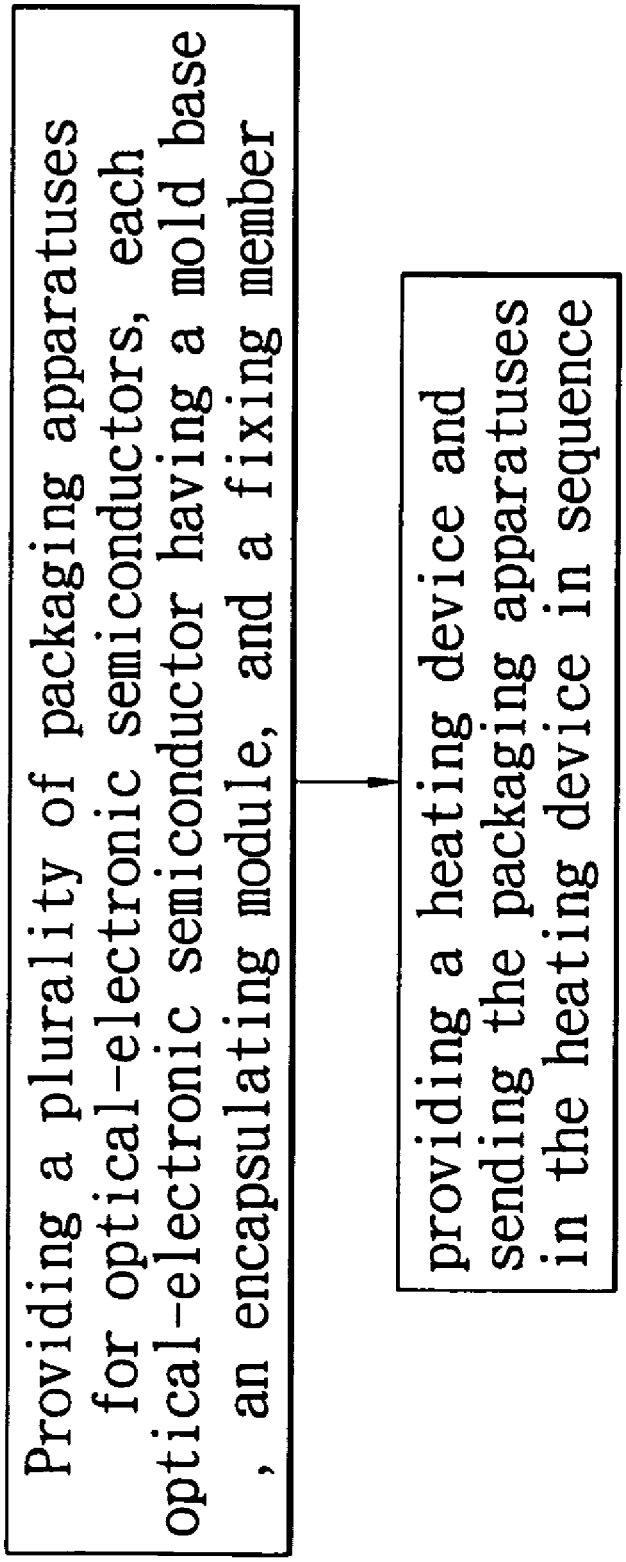
FIG. 7 is a flow chart showing the packaging method for optical-electronic semiconductors according to the present invention.

Please refer to FIG. 5, the front view of the fixing member 13 is a T-shape structure, and the fixing member 13 is provided for pressing and supporting functions. In other words, the fixing member 13 can be a supporting member or a pressing member in order to provide fixing, pressing, supporting and other functions. The fixing member 13 has two side portions 131 attached to the opposite side of a protruding block 132. The holding slot 133 is formed between the protruding block 132 and the side portion 131, in other words, the protruding block 132 is attached between each two adjacent holding slots 133. Further, the side surface 134 of the protruding block 132 has to be perpendicular to the plate 121 (referring to FIG. 1) so that the vertical of the supporting members 123 is well maintained. Because the supporting members 123 are held by the holding slots 133 and meets firmly against the side surface 134 of the protruding block 132, the supporting members 123 are supported with precise angle and position. Therefore, the supporting members 123 are prevented from shifting off-center and the packaging precision between supporting members 123 and the lens are improved. Alternatively, the length of the two side portions 131 can be longer than that of the protruding block 132 so that the two side portions 131 are protruded for pressing and holding the encapsulating module 12. In other words, the encapsulating module 12 can be pressed by the center portion of the fixing member 13 (protruding block 132) or by the edge portion of the fixing member 13 (side portion 131).

Additionally, the packaging apparatuses 1 are provided for an encapsulating machine. Because of the great size of the encapsulating machine and its limited enclosed space, it's necessary to optimize the packing of packaging apparatuses 1 inside the encapsulating machine as much as possible. Therefore, the predetermined width W of the mold base 11 has to be modified depending on the length of the encapsulating machine. In the embodiment, the length of the encapsulating machine is 6000 mm and the predetermined width W is 25 mm. Accordingly, the encapsulating machine receives 480 columns of the supporting members 123 (the same columns of the molding bodies 122). On the contrary, the encapsulating machine receives only 300 columns of the molding bodies 122. Thus the throughput of the encapsulating process is increasing. However, the predetermined width W of the mold base 11 can be modified according to the length of the encapsulating machine or the size of the molding bodies 122 and 25 mm as W is not a absolute limit.

In another embodiment, the packaging apparatus 1 for optical-electronic semiconductors, comprising: a mold base 11 having at least one first air-vent 111 at a bottom thereof; an encapsulating module 12 attached to the mold base 11, and a fixing member 13 attached onto the mold base 11 for fixing the supporting members 123. The encapsulating module 12 has a plate 121 engaged with the mold base 11, a plurality of molding bodies 122 penetratingly mounted on the plate 121, and a plurality of supporting members 123 connected to the molding bodies 122. Further, the features of the elements of the embodiment have the same structure with the above-mentioned disclosure.

A packaging method using the packaging apparatuses 1 is further disclosed. The packaging method includes:

(a). providing a plurality of packaging apparatuses 1 for optical-electronic semiconductors. Each packaging apparatus 1 comprises a mold base 11, an encapsulating module 12 attached to mold base 11, and a fixing member 13 attached onto encapsulating module 12. The mold base 11 has a longitudinal receiving space 110 and at least one first air-vent 111 at the bottom thereof. The mold base 11 has a predetermined width W and the first air-vent 111 communicates with the longitudinal receiving space 110. The encapsulating module 12 has a plate 121 engaged with the mold base 11, a plurality of columns of molding bodies 122 penetratingly mounted on the plate 121 and received in the longitudinal receiving space 110, and a plurality of columns of supporting members 123 connected to the molding bodies 122. The fixing member 13 has a plurality of columns of holding slots 133 for holding the supporting members 123 of the encapsulating module 12.

The mold base 11 further has a fixed hole 112 (shown in FIG. 3) on two ends thereof, and the fixing member 13 has a fixed body 135 (shown in FIG. 2) on two ends thereof corresponding to the fixed hole 112. Thus, step (a) further comprises an engaging step for engaging the fixing member 13 with the mold base 11, and the engaging step is provided for engaging one fixed body 135 attached on two ends of the fixing member 13 with one fixed hole 112 defined on two ends of the mold base 11.

Furthermore, the fixing member 13 has a plurality of holding slots 133 for holding the supporting members 123. Thus, step (a) further comprises a locking step for locking the plurality of columns of supporting members 123 on the fixing member 13. Specifically, the locking step is provided for locking the plurality of columns of supporting members 123 with the plurality of columns of holding slots 133 of the fixing member 13.

(b). providing a heating device 2 (shown in FIG. 6) and sending the packaging apparatuses 1 into the heating device 2 in sequence. In this step, each packaging apparatus 1 is pushed by another packaging apparatus 1 immediately behind so as to enter into the heating device 2. In another word, each packaging apparatus 1 contact with another packaging apparatus 1 and therefore the heating device 2 can contain more packaging apparatus 1. The heating device 2 is, for example a furnace. The furnace provides for heated air with a predetermined temperature. The heated air flows into the longitudinal receiving space 110 through the first air-vents 111 so that the molding bodies 122 are uniformly heated. The difference between real heating temperature of the molding bodies 122 and the preset temperature of the heating device 2 is reduced because of balanced air distribution. Therefore, the heating uniformity of the molding bodies 122 is improved.

Furthermore, in order to cure the polymer such as Epoxy completely, the packaging apparatus 1 has to stay in the heating device 2 for a predetermined period. The packaging apparatus 1 is applied for but not restricted to an automatic encapsulating process.

To sum up, the present invention achieves the following advantages:

1. In accordance with the present invention, the improved stability is achieved. Fixing member 13 is used for holding the supporting members 123 and maintaining the positions of the supporting members 123 so that the problem of supporting members 123 shifting off-center is solved.

2. The mold base 11 has the first air-vents 111 and the second air-vents 113 so that heated air can flow into the longitudinal receiving space 110 through the first air-vents 111 and the second air-vents 113. Therefore, the molding bodies 122 inside the longitudinal receiving space 110 can be directly heated by the heated air so as to improve the uniformity of heating (curing) process. Furthermore, the circulation of the heated air can improve the heating quality.

3. The width of the mold base 11 is modified with regard to the length of the heating device 2 so that heating device 2 can receive more packaging apparatus 1 without increasing the size of the heating device 2. Thus, the efficiency of the process is improved.

Although the present invention has been described with reference to the foregoing preferred embodiment, it shall be understood that the invention is not limited to the details thereof. Various equivalent variations and modifications may occur to those skilled in this art in view of the teachings of the present invention. Thus, all such variations and equivalent modifications are also embraced within the scope of the invention as defined in the appended claims.

What is claimed is:

1. A packaging apparatus for optical-electronic semiconductors, comprising:
   a mold base having at least one first air-vent at a bottom thereof;
   an encapsulating module removably attached to the mold base, the encapsulating module having:
   a plate slidably engaged with the mold base,
   at least two spaced apart rows of molding bodies penetratingly mounted on the plate, and
   at least two spaced apart rows of supporting members, each connected at a lower end thereof to a respective one of the molding bodies; and
   a fixing member removably attached to said mold base and having at least two side surfaces extending substantially in perpendicular to said plate, and at least two rows of holding slots adjacent to said at least two side surfaces, wherein each of said at least two rows of holding slots receives a to end of a respective one of said supporting members, and wherein said respective supporting member is maintained substantially perpendicular to said plate by being pressed against a respective one of said side surfaces of said fixing member.

2. The packaging apparatus according to claim 1, wherein the mold base further comprises a space receiving the molding bodies, the space being in communication with the first air-vent.

3. The packaging apparatus according to claim 2, wherein the mold base further comprises at least one second air-vent on each side of the mold base, wherein the second air-vent communicates with the space.

4. The packaging apparatus according to claim 1, wherein the fixing member further comprises a protruding block extending along the fixing member for stabilizing the supporting members, wherein said protruding block has said at least two side surfaces.

5. The packaging apparatus according to claim 1, wherein the mold base further has a fixed hole at two ends thereof.

6. The packaging apparatus according to claim 5, wherein the fixing member has a fixed body at two ends thereof, and wherein the fixed body is engaged with the fixed hole.

7. A packaging apparatus for optical-electronic semiconductors, comprising:
   a mold base;
   an encapsulating module attached to the mold base, the encapsulating module having:
   a plate slidably engaged with the mold base,
   at least two spaced apart rows of molding bodies penetratingly mounted on the plate,
   at least two spaced apart rows of supporting members, each supporting member being connected to a respective one of the molding bodies; and
   a pressing member removably attached to the mold base for pressing the supporting members against said plate, said pressing member having at least two side surfaces extending substantially in perpendicular to said plate, and at least two rows of holding slots adjacent to said at least two side surfaces, wherein each of said at least two rows of holding slots receives a top end of a respective one of said supporting members, and wherein said respective supporting member is maintained substantially perpendicular to said plate by being pressed against a respective one of said side surfaces of said pressing member.

8. The packaging apparatus according to claim 7, wherein the pressing member further comprises a protruding block between two adjacent rows of the holding slots, said protruding block having said at least two side surfaces.

9. The packaging apparatus according to claim 7, wherein the mold base further has a fixed hole at two ends thereof.

10. The packaging apparatus according to claim 9, wherein the fixing member has a fixed body at two ends thereof and the fixed body is engaged with the fixed hole.

11. A packaging apparatus for optical-electronic semiconductors, comprising:
   a mold base having at least one first air-vent at a bottom thereof;
   an encapsulating module attached to the mold base, the encapsulating module having:
   a plate slidably engaged with the mold base,
   a plurality of molding bodies penetratingly mounted on the plate, and
   a plurality of supporting members connected to the molding bodies; and a fixing member removably attached onto the mold base for maintaining the supporting members in a predetermined position, said fixing member having at least two side surfaces extending substantially in perpendicular to said plate, and at least two rows of holding slots adjacent to said at least two side surfaces, wherein each of said at least two rows of holding slots receives a top end of a respective one of said supporting members, and wherein said respective supporting member is maintained substantially perpendicular to said plate by being pressed against a respective one of said side surfaces of said fixing member.

12. The packaging apparatus according to claim 11, wherein the mold base further comprises a space receiving the molding bodies, and wherein the space communicates with the first air-vent.

13. The packaging apparatus according to claim 12, wherein the mold base further comprises at least one second air-vent on each side of the mold base, and wherein the second air-vent communicates with the space.

14. The packaging apparatus according to claim 11, wherein the fixing member further comprises a protruding block extended from the fixing member for stabilizing the supporting members.

15. The packaging apparatus according to claim 11, wherein the fixing member comprises a fixed body at two ends thereof, and wherein the fixed body is engaged with the mold base.

* * * * *